United States Patent
Hirotsuru et al.

(10) Patent No.: US 9,017,824 B2
(45) Date of Patent: Apr. 28, 2015

(54) ALUMINUM-DIAMOND COMPOSITE AND MANUFACTURING METHOD

(75) Inventors: Hideki Hirotsuru, Omuta (JP); Hideo Tsukamoto, Omuta (JP)

(73) Assignee: Denki Kagaku Kogyo Kabushiki Kaisha, Tokyo (JP)

(*) Notice: Subject to any disclaimer, the term of this patent is extended or adjusted under 35 U.S.C. 154(b) by 733 days.

(21) Appl. No.: 13/054,342

(22) PCT Filed: Jul. 8, 2009

(86) PCT No.: PCT/JP2009/062445
§ 371 (c)(1),
(2), (4) Date: Jan. 14, 2011

(87) PCT Pub. No.: WO2010/007922
PCT Pub. Date: Jan. 21, 2010

(65) Prior Publication Data
US 2011/0123821 A1    May 26, 2011

(30) Foreign Application Priority Data

Jul. 17, 2008    (JP) .................. 2008-186580

(51) Int. Cl.
*B32B 3/10*    (2006.01)
*B32B 27/32*    (2006.01)
(Continued)

(52) U.S. Cl.
CPC . *C22C 26/00* (2013.01); *B22F 3/26* (2013.01); *B22F 7/04* (2013.01); *B22F 2998/00* (2013.01);
(Continued)

(58) Field of Classification Search
USPC ........ 164/72, 97, 98; 428/137, 220, 332, 596, 428/634, 650, 687, 689
See application file for complete search history.

(56) References Cited

U.S. PATENT DOCUMENTS 5,451,352 A    9/1995    Cook
8,322,398 B2 *  12/2012   Hirotsuru et al. ............... 164/98
(Continued)

FOREIGN PATENT DOCUMENTS

CN    101427367    5/2009
EP    0475575    3/1992
(Continued)

OTHER PUBLICATIONS

Machine english tranaslation of Akiyoshi et al. (JP 2007-247058), provided by the JPO website, internet retrieval date of Jul. 7, 2013.*
(Continued)

*Primary Examiner* — Jonathan Langman
(74) *Attorney, Agent, or Firm* — Oblon, McClelland, Maier & Neustadt, L.L.P.

(57) ABSTRACT

Disclosed is an aluminum-diamond composite having both high thermal conductivity and thermal expansion coefficient close to those of semiconductor elements, which is improved in platability in the surface and surface roughness so that the composite becomes suitable for use as a heat sink of a semiconductor element of the like. Specifically disclosed is a plate-like aluminum-diamond composite containing diamond particles and a metal mainly composed of aluminum. The aluminum-diamond composite is composed of a composite part and surface layers formed on both sides of the composite part, and the surface layers are composed of a material containing a metal mainly composed of aluminum. The diamond particle content is 40-70% by volume of the entire aluminum-diamond composite.

10 Claims, 1 Drawing Sheet

(51) Int. Cl.
*G11B 11/105* (2006.01)
*C03C 27/00* (2006.01)
*B32B 15/01* (2006.01)
*B23P 9/00* (2006.01)
*B32B 9/00* (2006.01)
*B22C 3/00* (2006.01)
*B22D 19/14* (2006.01)
*B22D 19/00* (2006.01)
*C22C 26/00* (2006.01)
*B22F 3/26* (2006.01)
*B22F 7/04* (2006.01)
*H01L 23/373* (2006.01)
*H01L 21/48* (2006.01)

(52) U.S. Cl.
CPC ......... *B22F 2998/10* (2013.01); *H01L 21/4882* (2013.01); *H01L 23/3732* (2013.01); *H01L 23/3735* (2013.01); *C22C 2204/00* (2013.01); *H01L 2924/0002* (2013.01)

(56) References Cited

U.S. PATENT DOCUMENTS

| | | | |
|---|---|---|---|
| 2008/0122052 A1* | 5/2008 | Fukui | 257/678 |
| 2009/0092793 A1* | 4/2009 | Hirotsuru et al. | 428/158 |
| 2010/0110637 A1 | 5/2010 | Pickard et al. | |

FOREIGN PATENT DOCUMENTS

| | | | |
|---|---|---|---|
| EP | 0813243 | 12/1997 | |
| JP | 9 157773 | 6/1997 | |
| JP | 11-277217 | 10/1999 | |
| JP | 2000 303126 | 10/2000 | |
| JP | 2005 238331 | 9/2005 | |
| JP | 2006-261569 | 9/2006 | |
| JP | 2007 518875 | 7/2007 | |
| JP | 2007 247058 | 9/2007 | |
| JP | 2008 42011 | 2/2008 | |
| RU | 1797603 A3 | 2/1993 | |
| RU | 1827118 A3 | 5/1995 | |
| WO | 95/04165 | 2/1995 | |
| WO | WO-2007-125878 * | 8/2007 | H01L 23/373 |

OTHER PUBLICATIONS

U.S. Appl. No. 13/054,266, filed Mar. 28, 2011, Hirotsuru et al.

International Search Report issued Sep. 8, 2009 in PCT/JP09/62445 filed Jul. 8, 2009.

Extended European Search Report dated Jul. 11, 2014, in corresponding application No. 09797847.2.

* cited by examiner

ALUMINUM-DIAMOND COMPOSITE AND MANUFACTURING METHOD

TECHNICAL FIELD

The present invention relates to an aluminum-diamond composite and method for producing the same.

BACKGROUND ART

In semiconductor devices such as semiconductor laser devices and high performance MPU's (microprocessing units) used in optical communications and the like, the issue of how to efficiently dissipate the heat from the devices is crucial for preventing malfunctions.

In recent years, advances in semiconductor device technologies have resulted in higher outputs, higher speeds and higher integration of devices, thus requiring even greater heat dissipation. This has resulted in demands for higher thermal conductivity in heat dissipating components such as heat sinks, so that copper (Cu), having a high thermal conductivity of 390 W/mK, has been used.

On the other hand, the higher outputs required of individual semiconductor devices has caused them to become larger in size, thereby raising the problem of mismatched thermal expansion between semiconductor devices and heat sinks used for heat dissipation. This problem has led to a demand for the development of a heat sink material having both high thermal conductivity and a thermal expansion coefficient matching with that of semiconductor devices. Composites of metals and ceramics, such as a composite of aluminum (Al) and silicon carbide (SiC), have been proposed (Patent Document 1) as such materials.

However, with Al—SiC type composite materials, no matter how the conditions are optimized, the thermal conductivity will never be more than 300 W/mK, so the development of a heat sink material having even higher thermal conductivity, equal to or greater than the thermal conductivity of copper, is desired. As such a material, a metal-diamond composite, combining the high thermal conductivity of diamond with the high coefficient of thermal expansion of metals and thus having a high thermal conductivity and a coefficient of thermal expansion close to that of semiconductor device materials, has been proposed (Patent Document 2).

Additionally, in Patent Document 3, a β-type SiC layer is formed on a surface having diamond grains, so as to suppress the formation of metal carbides of low thermal conductivity during the compositing process and improve the wettability for molten metals, thereby improving the thermal conductivity of the resulting metal-diamond composite material.

Furthermore, since diamond is an extremely hard material, the metal-diamond composite materials obtained by compositing with metals are similarly very hard, and they are difficult to work. For this reason, metal-diamond composite materials are usually not easily workable with diamond machine tools, so when wishing to use metal-diamond composites in heat sinks which are small and come in a variety of shapes, the problem is how to shape the material at a low cost. Since metal-ceramic composite materials are capable of conducting electricity, processing methods using electrical discharge processing have been considered as a potential solution.

Patent Document 1: JPH9-157773A
Patent Document 2: JP2000-303126
Patent Document 3: JP 2007-518875T

SUMMARY OF THE INVENTION

However, when a heat sink material as described above is used, the heat sink is usually connected by soldering to a semiconductor device in order to improve the efficiency of dissipation of the heat generated by the semiconductor device. For this reason, heat sinks used for such applications must be plated on the surfaces to be soldered, and in the case of conventional metal-diamond composites, it can be difficult to form a plating layer if diamond grains are exposed on the soldering surface, as a result of which the thermal resistance can increase at the soldering boundary. Furthermore, if the soldering surface is rough, then the thickness of the solder layer can become uneven, thus reducing the heat dissipating ability. For this reason, the properties demanded of heat sink materials include platability and low surface roughness.

Therefore, a composite material with improved surface platability and surface roughness while also having a high thermal conductivity and a coefficient of thermal expansion close to that of semiconductor devices is wanted.

In other words, the purpose of the present invention is to offer an aluminum-diamond composite having both high thermal conductivity and a coefficient of thermal expansion close to that of semiconductor devices, while also having improved surface platability and surface roughness making it suitable for use as a heat sink for semiconductor devices.

The aluminum-diamond composite according to the present invention is a plate-shaped aluminum-diamond composite comprising diamond grains and a metal having aluminum as its main component, the aluminum-diamond composite consisting of a composite portion and surface layers provided on both surfaces of the composite portion, the surface layers consisting of a material comprising a metal having aluminum as its main component, the diamond grains being contained in an amount of 40% to 70% by volume with respect to the entire aluminum-diamond composite.

The aluminum-diamond composite described above has a high thermal conductivity and a coefficient of thermal expansion close to that of semiconductor devices, as well as improved surface platability and little surface roughness.

The aluminum-diamond composite of the present invention has a high thermal conductivity and a coefficient of thermal expansion close to that of semiconductor devices, as well as improved surface platability and little surface roughness, and can therefore be used favorably in heat sinks for heat dissipation of semiconductor devices.

EXPLANATION OF REFERENCE NUMBERS

Figure 1:
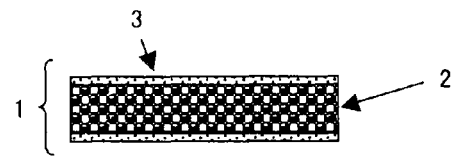
FIG. 1 A view of the structure of an aluminum-diamond composite according to Embodiment 1.

1 aluminum-diamond composite
2 composite portion
3 surface layer
4 mold composed of porous material
5 metal plate
6 mold release plate coated with mold release material
7 diamond powder
8 outer perimeter portion
9 hole portion
10 ceramic fiber

MODES FOR CARRYING OUT THE INVENTION

Explanation of Terminology

In the present specification, the expression "to" shall be inclusive at both ends. In other words, "A to B" shall mean equal to or greater than A and equal to or less than B.

In the present specification, "both surfaces" shall refer to the top and bottom surfaces of the aluminum-diamond composite which is plate-shaped. Additionally, in the present specification, "side surface portion" shall refer to the side surfaces of the plate-shaped aluminum-diamond composite, in other words, the portions roughly perpendicular to "both surfaces" defined above.

Additionally, in the present specification "hole portion" shall refer to a through hole passing through the top and bottom surfaces of the plate-shaped aluminum-diamond composite, provided for the purpose of screwing the components of the present invention to other heat dissipating elements.

Herebelow, embodiments for carrying out the aluminum-diamond composite of the present invention and its production method will be explained.

Embodiment 1

The aluminum-diamond composite (reference number 1 in FIG. 1) of the present embodiment is a plate-shaped aluminum-diamond composite comprising diamond grains and a metal having aluminum as the main component, the aluminum-diamond composite 1 consisting of a composite portion (reference number 2 in FIG. 1) and surface layers (reference number 3 in FIG. 1) provided on both surfaces of the composite portion 2, the aforementioned surface layers 3 composed of a material comprising a metal having aluminum as the main component, and the diamond grains being contained in an amount of 40% to 70% by volume with respect to the entire aluminum-diamond composite.

The aluminum-diamond composite of the above composition has a high thermal conductivity and a coefficient of thermal expansion close to that of semiconductor devices, as well as improved surface platability and little surface roughness.

Herebelow, the method of production of the aluminum-diamond composite of the present embodiment, based on a liquid metal forging method, shall be described.

The production methods for the aluminum-diamond composite can be largely divided into the impregnation method and the powder metallurgy method. Of these, impregnation is more often used commercially for providing better properties such as thermal conductivity. There are also various methods of impregnation, such as those performed at standard pressure, and high-pressure forging which is performed at high pressure. High-pressure forging includes liquid metal forging and die casting.

The preferable method in the present invention is high-pressure forging which involves impregnation at high pressure, more specifically liquid metal forging for providing fine composites excelling in properties such as thermal conductivity. Liquid metal forging generally involves filling a high-pressure container with a powder or compact of diamond, and impregnating with molten aluminum alloy or the like at a high temperature and high pressure to obtain a composite material.

[Diamond Powder]

The diamond powder used as the raw material may be either a natural diamond powder or a synthetic diamond powder. Additionally, a binder such as silica or the like may be added to the diamond powder as needed. By adding a binder, it is possible to achieve the effect of forming a compact.

Regarding the granularity of the diamond powder, the powder should have an average grain size of at least 50 μm, and more preferably, an average grain size of at least 100 μm in view of the thermal conductivity. As for the upper limit for the grain size of the diamond grains, there is no particular limit in terms of the resulting properties, as long as it is no more than the thickness of the composite, but it should preferably be no more than 500 μm in order to obtain a composite at a reasonable cost.

The amount of the diamond grains in the aluminum-diamond composite should preferably be at least 40% by volume and at most 70% by volume. As long as the diamond grain content is at least 40% by volume, the thermal conductivity of the resulting aluminum-diamond composite will be sufficient. Additionally, in terms of the filling ability, the diamond particle content should preferably be no more than 70% by volume. As long as it is 70% by volume or less, there is no need to shape the diamond grains to form spheres, and an aluminum-diamond composite can be obtained at a reasonable cost.

In a composite obtained by liquid metal forging, the melt will fill in the spaces between powder particles under appropriate conditions, so that the proportion of the volume of the powder to the filled volume will be roughly equal to the volume of the powder material (grain content) with respect to the volume of the resulting composite in its entirety.

Furthermore, by using a diamond powder having a p-type silicon carbide layer formed on the surfaces of the diamond grains, the formation of metal carbides ($Al_4C_3$) of low thermal conductivity during compositing can be suppressed, and the wettability for molten aluminum can be improved. As a result, the effect of improving the thermal conductivity of the aluminum-diamond composite can be achieved.

Figure 2:
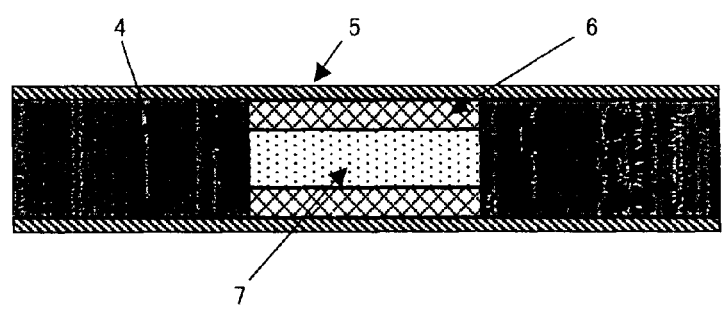
FIG. 2 A section view of a layered structure before compositing of the aluminum-diamond composite according to Embodiment 1.

In preparation for liquid metal forging, a mold (reference number 4 of FIG. 2) consisting of a porous material capable of being impregnated by an aluminum alloy, a fine mold release plate (reference number 6 in FIG. 2) coated with a mold release agent and the above-mentioned diamond powder (reference number 7 in FIG. 2) are arranged as shown in FIG. 2 to form a structure for liquid metal forging consisting of a mold 4, a mold release plate 6 and a loaded diamond powder 7.

FIG. 2 is a section view of a structure for liquid metal forging, being a cross section of a portion to which the diamond powder has been loaded. When the aluminum alloy and diamond powder are composited by liquid metal forging, the aluminum alloy reaches the portion filled with diamond powder by passing through the mold composed of a porous material.

[Mold Composed of Porous Material]

In this case, there are no particular restrictions on the material of the mold 4 composed of a porous material that can be impregnated with an aluminum alloy by liquid metal forging, as long as it is a porous material that can be impregnated by an aluminum alloy by liquid metal forging. However, the porous material is preferably a porous material such as graphite, boron nitride or alumina fiber, for their excellent heat resistance allowing stable delivery of melt.

[Mold Release Plate]

Additionally, the fine mold release plate 6 may be a stainless steel plate or ceramic plate, and there are no particular restrictions as long as it is a fine material that will not be impregnated by the aluminum alloy during liquid metal forging. Additionally, the mold release agent coated onto the mold release plate is preferably a mold release agent excelling in heat resistance such as graphite, boron nitride or alumina. Furthermore, a mold release plate capable of more stable mold release can be obtained by coating with the above mold release agent after coating the surface of the mold release plate with an alumina sol or the like.

The present embodiment is characterized in that the mold release plates 6 provided on both surfaces are separated after compositing. Due to this characteristic structure, an aluminum-diamond composite having very smooth surfaces can be obtained.

[Aluminum Alloy]

The aluminum alloy (metal having aluminum as the main component) in the aluminum-diamond composite according to the present embodiment should preferably have a low melting point in order to enable it to adequately penetrate into the gaps (between diamond grains) in the diamond powder during impregnation.

Examples of such aluminum alloys include aluminum alloys comprising 5% to 25% by mass of silicon. By using an aluminum alloy comprising 5% to 25% by mass of silicon, the aluminum-diamond composite can be made finer.

Furthermore, it is preferable for the aluminum alloy to contain magnesium since this makes for a firmer bond between the diamond grains and the metal portion. As for metal components other than aluminum, silicon and magnesium in the aluminum alloy, there are no particular limits as long as they do not result in any profound changes to the properties of the aluminum alloy. For example, copper could be included.

The thickness of the aluminum-diamond composite of the present embodiment can be adjusted by the amount of diamond grains loaded during compositing, and the thickness should preferably be 0.4 to 6 mm. As long as the thickness is at least 0.4 mm, sufficient strength for use as a heat sink can be obtained. Additionally, if the thickness is no more than 6 mm, the cost of the materials can be suppressed, while achieving sufficient thermal conductivity.

Multiple layers of the resulting structure are stacked to form blocks, and these blocks are heated at about 600° C. to 750° C. One or more of these blocks are placed inside a high-pressure container, an aluminum alloy melt heated to above the melting point is delivered as quickly as possible in order to prevent the temperature of the blocks from dropping, and a pressure of at least 20 MPa is applied.

As shown in FIG. 2, metal plates 5 may also be provided on both surfaces of the structure. Additionally, when a plurality of the structures are stacked to form blocks as described above, they may be stacked with such metal plates 5 inserted between the structures. By providing such mold release plates, uniform impregnation by the melt is possible, and the extraction of the aluminum-diamond composite after the impregnation step can be easily performed.

As a result of the above operations, the spaces in the diamond powder are impregnated with an aluminum alloy, thereby yielding a plate-shaped aluminum-diamond compact covered by surface layers having aluminum as the main component.

In this case, as long as the block heating temperature is at least 600° C., the aluminum alloy can be stably composited, and an aluminum-diamond composite having sufficient thermal conductivity can be obtained. Additionally, as long as the heating temperature is no more than 750° C., the generation of aluminum carbide ($Al_4C_3$) on the surfaces of the diamond powder during compositing of the aluminum alloy can be avoided, thereby enabling an aluminum-diamond composite with sufficient thermal conductivity to be obtained.

Additionally, regarding the pressure during impregnation, the aluminum alloy can be stably composited and an aluminum-diamond composite having sufficient thermal conductivity can be obtained as long as it is at least 20 MPa. More preferably, the impregnation pressure should be at least 50 MPa. As long as it is at least 50 MPa, an aluminum-diamond composite having more stable thermal conductivity properties can be obtained.

[Anneal]

The aluminum-diamond compact resulting from the above operations can also be subjected to an anneal treatment. Anneal treatments can eliminate strain in the aluminum-diamond compact, resulting in an aluminum-diamond composite having more stable thermal conductivity properties.

In order to eliminate only the strain in the compact without affecting the surface of the resulting aluminum-diamond compact, the aforementioned anneal should be performed for at least 10 minutes at a temperature of 400° C. to 550° C.

[Working]

Next, an example of a method of working the aluminum-diamond compact according to the present embodiment shall be explained. While the above aluminum-diamond compact is an extremely hard material that is difficult to work, the aluminum-diamond composite can be worked by using a water-jet tool to form an outer perimeter portion (side surface portions) (reference number 8 in FIG. 3) and hole portions (reference number 9 in FIG. 3). The resulting aluminum-diamond composite has a structure in which the composite portion 2 is exposed at the outer perimeter portion 8 and hole portions 9, as shown in FIGS. 1 and 3.

Figure 3:
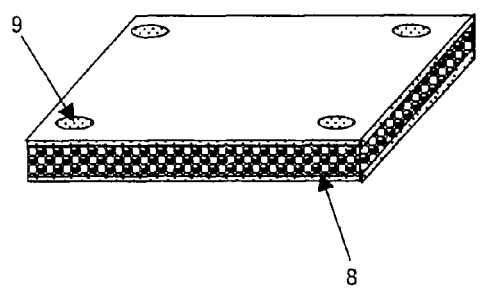
FIG. 3 A perspective view of an aluminum-diamond composite according to Embodiment 1.

The aforementioned hole portions 9 need only be provided in such a manner as to penetrate through from the top to the bottom surface to enable the composite to be screwed to another heat dissipating component as shown in FIG. 3. The working costs can be reduced, for example, by working them to a U-shape connected with the outer perimeter portion.

Additionally, since the aluminum-diamond compact of the present embodiment is a conductive material, the outer perimeter portion 8 and hole portions 9 can be worked by means of an electrical discharge tool. The resulting aluminum-diamond composite has a structure in which the composite portion 2 is exposed at the outer perimeter portion 8 and the hole portions 9.

While the aluminum-diamond compact of the present embodiment may be worked using conventional diamond tools, it is an extremely hard material that is difficult to work, so the use of water-jet tools or electrical discharge tools is preferable in consideration of the durability of the tools and the cost.

[Surface Layer]

The aluminum-diamond composite of the present embodiment is characterized in that both surfaces of the composite portion (reference number 2 in FIG. 1) are covered by a surface layer (reference number 3) composed of a material comprising a metal having aluminum as the main component (aluminum alloy).

While the surface layer 3 is composed of a material comprising a metal having aluminum as the main component, it may contain substances other than the metal having aluminum as the main component. In other words, it may contain the aforementioned diamond grains, or other impurities.

However, the diamond grains should preferably not be present at any portion 0.02 mm from the surface of the surface layer 3. As a result of this structure, working methods that are employed in normal metal working can be used, and the surface layer 3 can be smoothed without leaving any polishing scars.

Additionally, the aforementioned surface layer 3 preferably contains the metal having aluminum as the main component in an amount of at least 80% by volume. As long as the amount of the metal having aluminum as the main component is at least 80% by volume, working methods that are employed in normal metal working can be used, and the surface layer 3 can be polished. Furthermore, the amount of the metal having aluminum as the main component is preferably at least 90% by volume. As long as the amount of the metal having aluminum as the main component is at least 90% by volume, impurities inside will not be released and cause polishing scars when polishing the surface.

Additionally, the thickness of the surface layer 3 should preferably be at least 0.03 mm and at most 0.3 mm by average thickness. As long as the average thickness of the surface layer 3 is at least 0.03 mm, the diamond grains will not be exposed in subsequent processing, and the desired surface precision and platability can be easily achieved. Additionally, as long as the average thickness is no more than 0.3 mm, the thickness of the composite portion 2 within the resulting aluminum-diamond composite 1 will be sufficient, ensuring that sufficient thermal conductivity is achieved.

Additionally, the sum of the average thicknesses of the surface layers 3 on both surfaces should preferably be no more than 20% of the thickness of the aluminum-diamond composite 1, and more preferably no more than 10%. As long as the sum of the average thicknesses of the surface layers 3 on both surfaces is no more than 20% of the thickness of the aluminum-diamond composite 1, sufficient thermal conductivity can be obtained as well as surface precision and platability.

As shall be described below, the thickness of the surface layers 3 can be adjusted when compositing the aluminum alloy by providing a ceramic fiber such as alumina fiber between the diamond powder and the fine mold release plate coated with mold release agent when loading the diamond particles. Alternatively, it can be adjusted by using aluminum foil instead of ceramic fiber.

[Working of Surface Layers]

Since the aluminum-diamond composite of the present embodiment has a structure wherein both surfaces are covered by a surface layer 3 composed of a material comprising a metal having aluminum as the main component, the surface precision (surface roughness Ra) can be adjusted by working (polishing) the surface layer 3. The surface layer 3 may be worked using working methods normally used for working metals. For example, it can be polished using a buff polisher or the like to a surface roughness (Ra) of 1 µm or less.

Furthermore, the average thickness of the surface layer can be adjusted by working the surface layer 3. When using the aluminum-diamond composite of the present embodiment as a heat-dissipating component such as a heat sink, it should preferably have a smooth surface of low surface roughness in view of the thermal resistance at the soldered surfaces, so the surface roughness (Ra) should preferably be no more than 1 µm, and more preferably, no more than 0.5 µm. As long as the surface roughness is no more than 1 µm, the thickness of the solder layer can be kept uniform, resulting in a higher heat dissipation.

Additionally, regarding the planarity of the surface layer 2, it should preferably be no more than 30 µm, more preferably no more than 10 µm, when converted to a size of 50 mm×50 mm. As long as the planarity is no more than 30 µm, the thickness of the solder layer can be made even, thus resulting in higher heat dissipation.

[Composite Portion]

The aluminum-diamond composite of the present embodiment has a composite portion (reference number 2 of FIG. 1) of the aforementioned diamond grains and an aluminum alloy.

The boundary between the surface layer 3 and the composite portion 2 should preferably be clearly visible when observing a cross section of the aluminum-diamond composite using a microscope or the like. With an aluminum-diamond composite having this kind of structure, the diamond grains will not protrude from the surface layer 3 when polishing, so the diamond grains will not come free and cause polishing scars.

On the other hand, the surface layer 3 and composite portion 2 do not necessarily need to have a visible boundary. In an aluminum-diamond composite with such a structure, stresses are less likely to occur between the surface layer 3 and the composite portion 2, so the surface layer 3 will not be damaged when force is applied for polishing or the like.

[Plating]

When used as a heat sink for semiconductor devices, the aluminum-diamond composite of the present embodiment will often be soldered onto the semiconductor devices. Therefore, the surface of the aluminum-diamond composite to be soldered may be plated.

The method of plating is not particularly limited, and may be either non-electrolytic plating or electroplating. When plating onto aluminum, Ni plating or a double plating of Ni plating and Au plating is applied for solder wettability. In this case, the thickness of the plating should preferably be at least 0.5 and at most 10 µm.

As long as the plating thickness is at least 0.5 µm, it is possible to prevent the formation of plating pinholes and solder voids (spaces) when soldering, thereby obtaining good heat dissipation properties from the semiconductor devices. Additionally, as long as the plating thickness is no more than 10 µm, the influence of the Ni plating film which has low thermal conductivity can be minimized, so as to ensure good heat dissipation from the semiconductor devices. As for the purity of the Ni plating film, there are no particular restrictions as long as the solder wettability does not suffer, and it may include phosphorus, boron or the like.

Additionally, the aluminum-diamond composite of the present embodiment should preferably have a thermal conductivity of at least 400 W/mK when the temperature of the aluminum-diamond composite is 25° C., and a coefficient of thermal expansion of 5 to $10 \times 10^{-6}$/K from 25° C. to 150° C.

As long as the thermal conductivity is at least 400 W/mK at 25° C. and the coefficient of thermal expansion is 5 to $10 \times 10^{-6}$/K from 25° C. to 150° C., it will have high thermal conductivity and a low coefficient of thermal expansion comparable to that of semiconductor devices. For this reason, when used as a heat dissipating component such as a heat sink, it will have excellent heat dissipation properties and the difference in the coefficient of thermal expansion between semiconductor devices and the heat dissipating component will be small even when subject to temperature changes, thus enabling destruction of the semiconductor devices to be avoided. As a result, it can be favorably used as a highly reliable heat dissipating component.

Embodiment 2

Figure 4:
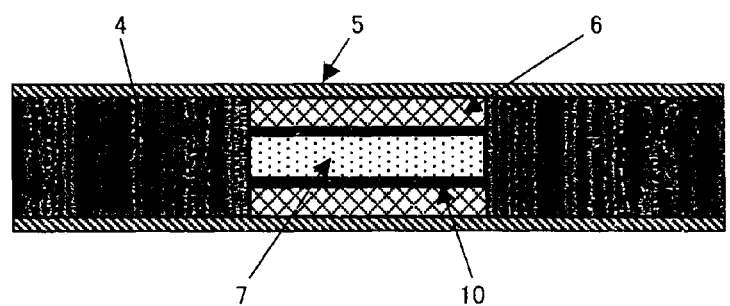
FIG. 4 A section view of a structure before compositing of an aluminum-diamond composite according to Embodiment 2.

Next, an aluminum-diamond composite according to Embodiment 2 will be explained. The aluminum-diamond composite according to Embodiment 2 can be obtained by providing a ceramic fiber 10 between the loaded diamond powder 7 and the fine mold release plate 6 coated with a mold release agent, as shown in FIG. 4, when compositing the aluminum alloy.

The aluminum-diamond composite obtained by the above production method has surface layers composed of an aluminum-ceramic composite material formed on both sides.

[Aluminum-Ceramic Composite Material]

The surface layer composed of an aluminum-ceramic composite material should preferably contain components other than the aluminum alloy in an amount of less than 20% by volume in view of the platability and surface precision. As long as the amount of components other than the aluminum alloy is less than 20% by volume, the surface layer can be easily worked.

Additionally, while not particularly limited, the ceramic fiber should preferably be a ceramic fiber such as an alumina fiber, a silica fiber or a mullite fiber in view of the heat resistance. The amount (Vf) of the ceramic fiber should preferably be no more than 10% by volume in view of the properties of the aluminum-ceramic composite material, and Vf should preferably be less than 20% by volume when layered and compressed.

Additionally, the thickness of the ceramic fiber should preferably be no more than 0.5 mm. As long as it is no more than 0.5 mm, the thickness of the surface layer can be appropriately set, so as to obtain an aluminum-diamond composite having sufficient thermal conductivity.

Aside from being provided with a surface layer composed of the aforementioned aluminum-ceramic composite material, Embodiment 2 is the same as Embodiment 1.

<Functions and Effects>

Herebelow, the functions and effects of the aluminum-diamond composites according to the above-described Embodiments 1 and 2 shall be explained.

The aluminum-diamond composite (reference number 1 in FIG. 1) of the present embodiment is a plate-shaped aluminum-diamond composite comprising diamond grains and a metal having aluminum as the main component, the aluminum-diamond composite 1 consisting of a composite portion (reference number 2 in FIG. 1) and surface layers (reference number 3 in FIG. 1) provided on both surfaces of the composite portion 2, the aforementioned surface layers 3 composed of a material comprising a metal having aluminum as the main component, and the diamond grains being contained in an amount of 40% to 70% by volume with respect to the entire aluminum-diamond composite.

The aluminum-diamond composite 1 of the above composition has a high thermal conductivity and a coefficient of thermal expansion close to that of semiconductor devices, as well as improved surface platability and little surface roughness.

Additionally, in the aluminum-diamond composite according to Embodiment 2, the aforementioned surface layer 3 is composed of an aluminum-ceramic composite material, and the thickness of the surface layer 3 can be adjusted to obtain an aluminum-diamond composite 1 having sufficient thermal conductivity.

Additionally, since the surface layer 3 contains the metal having aluminum as the main component in an amount of at least 80% by volume, the surface layer 3 can be polished by normal working methods employed in metal working.

Furthermore, since the thickness of the surface layer 3 is at least 0.03 mm and at most 0.3 mm, the desired surface precision and platability can be easily achieved, and sufficient thermal conductivity can be obtained.

Additionally, since the surface roughness (Ra) of the surface layer 3 is 1 μm or less, the thickness of the solder layer can be made uniform, allowing for better heat dissipation.

Additionally, since the thickness of the plate-shaped aluminum-diamond composite 1 is 0.4 to 6 mm, it has sufficient strength and heat dissipation properties for use as a heat dissipating component such as a heat sink.

Additionally, the thermal conductivity of the aluminum-diamond composite 1 is at least 400 W/mK at a temperature of 25° C., and the coefficient of thermal expansion is 5 to $50 \times 10^{-6}$/K when the temperature of the aluminum-diamond composite 1 varies from 25° C. to 150° C. As a result, when used as a heat dissipating component such as a heat sink, it excels in heat dissipation properties, and even when subjected to temperature changes, destruction of the semiconductor device can be prevented because the difference in coefficient of thermal expansion of the semiconductor device and the heat dissipating component is small.

Additionally, an Ni plating layer, or both an Ni plating and Au plating layer, may be provided on the surface of the aluminum-diamond composite 1 to a thickness of 0.5 to 10 μm. By doing so, high heat dissipating properties may be ensured when used as a heat dissipating component.

Additionally, the aluminum-diamond composite 1 may be produced by a liquid metal forging method. By doing so, a fine composite excelling in properties such as thermal conductivity can be obtained.

Additionally, the plate-shaped aluminum-diamond composite 1 may have hole portions 9, and the structure may be such that the composite portion 2 is exposed at a side surface portion 8 and hole portions 9 of the plate-shaped aluminum-diamond composite 1. In this way, when used as a heat dissipating component, it can be affixed by screws or the like.

The above-described aluminum-diamond composite can be obtained by a method comprising a step of loading diamond grains into a mold composed of a porous material in such a manner as to be sandwiched by mold release plates coated with a mold release agent, to form a structure consisting of said mold, said mold release plates and said loaded diamond grains; a step of heating said structure to 600° C. to 750° C.; and a step of producing a plate-shaped aluminum-diamond composite having both surfaces covered by a surface layer having aluminum as the main component, by impregnating the loaded diamond grains with an aluminum alloy heated to at least the melting point of the aluminum alloy at a pressure of at least 20 MPa.

Due to this production method, it is possible to obtain an aluminum-diamond composite having high thermal conductivity and a coefficient of thermal expansion close to that of semiconductor devices, and furthermore having improved surface platability and little surface roughness, making it favorable for use as a heat sink for dissipating heat in semiconductor devices.

Additionally, in the above-described production method, the step of producing the plate-shaped aluminum-diamond composite may be followed by a step of water-jet cutting or electrical discharge cutting to form side surface portions and hole portions in the plate-shaped aluminum-diamond composite. Due to this step, the composite can be affixed by screws when used as a heat-dissipating component.

While the aluminum-diamond composite and its production method according to the present invention have been explained by describing possible embodiments, the present invention is not to be construed as being limited thereto.

EXAMPLES

Herebelow, the present invention will be explained in further detail by providing examples and comparative examples, but the present invention is not to be construed as being limited thereto.

Examples 1-7

Commercially available high-purity diamond powder A (average grain size 190 μm), high-purity diamond powder B (average grain size 100 μm), high-purity diamond powder C (average grain size 50 μm) and an aluminum powder (average grain size 50 μm) were mixed in the ratios shown in Table 1.

TABLE 1

| Type | Diamond Powder A (mass %) | Diamond Powder B (mass %) | Diamond Powder C (mass %) | Aluminum Powder (mass %) | Vf (vol %) |
|---|---|---|---|---|---|
| Example 1 | 100 | 0 | 0 | 0 | 60 |
| Example 2 | 0 | 100 | 0 | 0 | 60 |
| Example 3 | 0 | 0 | 100 | 0 | 57 |
| Example 4 | 75 | 0 | 0 | 25 | 41 |
| Example 5 | 60 | 30 | 10 | 0 | 68 |
| Example 6 | 70 | 30 | 0 | 0 | 62 |
| Example 7 | 70 | 0 | 30 | 0 | 65 |

Note:
Vf (diamond grain content) computed as: (volume of diamond grains)/(load volume: $40 \times 40 \times 2$ mm = 3.2 cm$^3$)

Next, 40×40×2 mmt stainless steel plates (SUS430) were coated with an alumina sol and baked for 30 minutes at 350° C., then their surfaces were coated with a graphite mold release agent to produce mold release plates (reference number 6 of FIG. 2). Next, the diamond powders of Table 1 were loaded into an isotropic graphite jig (reference number 4 of FIG. 2) having a porosity of 20%, outer dimensions of 60×60×8 mmt and a 40 mm×40 mm×8 mm hole in a central portion, and sandwiched from both sides by the mold release plates 5, to form a structure.

The above structure was sandwiched between 60 mm×60 mm×1 mm stainless steel plates (reference number 5 of FIG. 2) coated with a graphite release agent, multiple such structures were stacked, 12 mm thick iron plates were placed on both sides, connected by six M10 bolts, and clamped by torque wrenches with a clamping torque of 10 Nm in the planar direction to form a single block.

Next, the resulting block was preheated to a temperature of 650° C. in an electric furnace, then placed in a preheated press mold with an inner diameter of 300 mm, and an aluminum alloy melt at a temperature of 800° C. comprising 12 mass % of silicon and 1 mass % of magnesium was poured in and compressed for 20 minutes at a pressure of 100 MPa to impregnate the diamond grains with the aluminum alloy. After cooling to room temperature, the block was cut to the shapes of the mold release plates using a wet bandsaw, and the stainless steel plates were removed. Then, it was annealed for three hours at a temperature of 530° C. to eliminate the strain from impregnation, resulting in an aluminum-diamond compact.

The resulting aluminum-diamond compact was polished on both surfaces using a #600 polishing paper, then buffed. Example 7 was polished on both surfaces using #600 polishing paper, but not buffed.

Next, an aluminum-diamond composite was worked to a shape of 25 mm×25 mm×2 mm by water-jet cutting (Sugino Machine Abrasive Jet Cutter NC) at a pressure of 250 MPa and a cutting speed of 50 mm/min, using garnets with a grain size of 100 μm as the polishing abrasive grains.

The cross section of the resulting aluminum-diamond composite was observed by a factory microscope and the average thicknesses of both surface layers (reference number 3 of FIG. 1) were measured. Additionally, the surface roughness (Ra) was measured using a surface roughness meter and the planarity was measured by 3D profile measurements.

Additionally, specimens for measurement of coefficient of thermal expansion (3 mm×2 mm×10 mm) and specimens for measurement of thermal conductivity (25 mm×25 mm×2 mm) were prepared by water-jet cutting. Using the respective specimens, the coefficient of thermal expansion for temperatures of 25° C. to 150° C. was measured using a thermal expansion meter (Seiko TMA300), and the thermal conductivity at 25° C. was measured using a laser flash technique (Rigaku LF/TCM-8510B). The results are shown in Table 2.

Additionally, the density of the aluminum-diamond composite of Example 1 upon measurement by Archimedes' Principle, was 3.10 g/cm$^3$. Furthermore, upon preparing a bending strength specimen (3 mm×2 mm×40 mm) for Example 1 and measuring the 3-point bending strength in a bending strength tester, it was 330 MPa.

TABLE 2

| Type | Average Thickness of Surface Layer (mm) | Surface Roughness Ra (μm) | Planarity (μm) | Thermal Conductivity (W/mK) | Coefficient of Thermal Expansion (×10$^{-6}$/K) |
|---|---|---|---|---|---|
| Example 1 | 0.06 | 0.28 | 1 | 510 | 7.0 |
| Example 2 | 0.06 | 0.27 | 2 | 480 | 7.0 |
| Example 3 | 0.05 | 0.25 | 1 | 450 | 7.5 |
| Example 4 | 0.06 | 0.20 | 3 | 410 | 9.2 |
| Example 5 | 0.05 | 0.30 | 2 | 530 | 5.2 |
| Example 6 | 0.06 | 0.28 | 1 | 500 | 6.2 |
| Example 7 | 0.07 | 0.90 | 3 | 510 | 5.9 |

Additionally, the aluminum-diamond composite was subjected to ultrasonic cleaning, then non-electrolytic Ni—P and Ni—B plating were performed to form an 8 μm thick plating layer (6 μm Ni—P+2 μm Ni—B) on the surfaces of the aluminum-diamond composites of Examples 1-7. The resulting plated products were subjected to solder flux tests in accordance with JIS Z3197 (corresponding to international standard ISO 9455), whereupon all of the plated products had a solder flux of at least 80%.

As shown in Table 2, the aluminum-diamond composites of Examples 1-7 had surface roughnesses of 0.20 to 0.90 μm, and were therefore very smooth, as well as having high thermal conductivity and coefficients of thermal expansion close to that of semiconductor devices.

Examples 8-17 and Comparative Examples 1-3

A 40 mm×40 mm×2 mm mold release plate as shown in Table 3 was coated with an alumina sol and baked for 30 minutes at 350° C., then the surfaces were coated with a graphite mold release agent to produce mold release plates (reference number 6 of FIG. 2). Then, diamond powder A (average grain size 190 μm) was loaded into a mold (loading jig) (reference number 4 of FIG. 2) as shown in Table 3, having outer dimensions of 60 mm×60 mm and a 40 mm×40 mm hole in a central portion, and sandwiched from both sides by the mold release plates 5 so that volume/loaded volume=60 vol %, to form a structure.

The aforementioned structure was sandwiched between 60 mm×60 mm×1 mm stainless steel plates (reference number 5 of FIG. 2) coated with a graphite release agent, multiple such structures were stacked, 12 mm thick iron plates were placed on both sides, connected by six M10 bolts, and clamped by torque wrenches with a clamping torque of 10 Nm in the planar direction to form a single block.

Next, the resulting block was preheated in an electric furnace, then placed in a preheated press mold with an inner diameter of 300 mm, and an aluminum alloy melt at a temperature of 800° C. comprising 12 mass % of silicon and 1 mass % of magnesium was poured in and compressed for 20 minutes at the pressures shown in Table 3 to impregnate the diamond grains with the aluminum alloy. After cooling to room temperature, the block was cut to the shapes of the mold release plates using a wet bandsaw, and the stainless steel plates were removed. Then, it was annealed for three hours at a temperature of 530° C. to eliminate the strain from impregnation, resulting in an aluminum-diamond compact.

TABLE 3

| Type | Mold Material | Mold Thickness (mm) | Material of Mold Release Plate A | Preheat Temp (° C.) | Impregnation Pressure (MPa) | Composite Material Thickness (mm) |
|---|---|---|---|---|---|---|
| Example 8 | graphite | 6.6 | stainless steel | 650 | 100 | 0.6 |
| Example 9 | graphite | 9.0 | stainless steel | 650 | 100 | 3.0 |
| Example 10 | graphite | 12.0 | stainless steel | 650 | 100 | 6.0 |
| Example 11 | graphite | 8.0 | stainless steel | 650 | 20 | 2.0 |
| Example 12 | graphite | 8.0 | stainless steel | 650 | 150 | 2.0 |
| Example 13 | graphite | 8.0 | stainless steel | 600 | 100 | 2.0 |
| Example 14 | boron nitride | 8.0 | stainless steel | 750 | 100 | 2.0 |
| Example 15 | graphite | 8.0 | silicon nitride | 650 | 100 | 2.0 |
| Example 16 | graphite | 8.0 | alumina | 650 | 100 | 2.0 |
| Example 17 | boron nitride | 8.0 | stainless steel | 650 | 100 | 2.0 |
| Comparative Example 1 | graphite | 8.0 | stainless steel | 650 | 5 | 2.0 |
| Comparative Example 2 | graphite | 8.0 | stainless steel | 500 | 100 | — |
| Comparative Example 3 | stainless steel | 8.0 | stainless steel | 650 | 20 | — |

The resulting aluminum-diamond compacts were polished with #600 paper on both sides, then buffed. Next, they were cut into 25 mm×25 mm×2 mm pieces using an electrical discharge cutter at a cutting speed of 5 mm/min. Then, the cross sections of the resulting aluminum-diamond composites were observed with a factory microscope and the surfaces measured for the presence of surface layers and their average thicknesses. Additionally, the surface roughness (Ra) was measured using a surface roughness meter and the planarity was measured using a 3D profile measurer. The results are shown in Table 4.

Additionally, specimens for measurement of coefficient of thermal expansion (3 mm×10 mm×plate thickness) and specimens for measurement of thermal conductivity (25 mm×25 mm×plate thickness) were prepared by electrical discharge cutting. Using the respective specimens, the coefficient of thermal expansion for temperatures of 25° C. to 150° C. and the thermal conductivity at 25° C. were measured in the same manner as Examples 1-7. The results are shown in Table 4.

TABLE 4

| Type | Average Thickness of Surface Layer (mm) | Surface Roughness Ra (μm) | Planarity (μm) | Thermal Conductivity (W/mK) | Coefficient of Thermal Expansion (×10$^{-6}$/K) |
|---|---|---|---|---|---|
| Example 8 | 0.04 | 0.75 | 5 | 430 | 8.0 |
| Example 9 | 0.06 | 0.30 | 1 | 520 | 6.9 |
| Example 10 | 0.06 | 0.29 | 1 | 530 | 6.7 |
| Example 11 | 0.05 | 0.28 | 2 | 490 | 7.0 |
| Example 12 | 0.05 | 0.29 | 2 | 510 | 7.1 |
| Example 13 | 0.06 | 0.28 | 1 | 500 | 7.0 |
| Example 14 | 0.05 | 0.25 | 1 | 510 | 7.0 |
| Example 15 | 0.06 | 0.32 | 1 | 510 | 6.9 |
| Example 16 | 0.06 | 0.31 | 2 | 510 | 7.0 |
| Example 17 | 0.05 | 0.29 | 1 | 510 | 7.0 |
| Comparative Example 1 | 0.06 | 1.50 | 5 | 250 | 6.5 |

Additionally, the aluminum-diamond composite was subjected to ultrasonic cleaning, then non-electrolytic Ni—P and non-electrolytic Au plating were performed to form a 6.05 μm thick plating layer (6 μm Ni—P+0.05 μm Au). The resulting plated products were subjected to solder flux tests in accordance with JIS Z3197, whereupon all of the plated products had a solder flux of at least 85%.

As shown in Table 4, the aluminum-diamond composites of Examples 8-17 had a surface roughness of 0.25 to 0.75 μm, and were therefore extremely smooth, as well as having high thermal conductivity and coefficients of thermal expansion close to that of semiconductor devices.

On the other hand, the aluminum-diamond composites of Comparative Example 1 did not have a surface layer which is the characteristic of the present invention, and the surfaces were rough even after polishing. Additionally, the desired thermal conductivity was not achieved. This is probably due to the fact that the pressure at the time of impregnation was less than 20 MPa.

Additionally, in Comparative Example 2, the spaces in the diamond powder were not fully impregnated with the aluminum alloy, so the compositing was incomplete. Additionally, the resulting compact had a density of 2.2 g/cm$^3$, was brittle, and was not in the desired plate shape. This is probably due to the fact that the preheating temperature in Comparative Example 2 was less than 600° C.

Additionally, in Comparative Example 3, the spaces in the diamond powder were left almost completely unimpregnated by the aluminum alloy, so a compact was not formed. Therefore, a plate-shaped aluminum-diamond composite was not able to be obtained. This is probably due to the fact that a non-porous stainless steel was used as the mold material.

Example 18

Using the same method as in Example 1, a high-purity diamond powder A (average grain size 190 μm) was used to prepare a stacked body, which was sandwiched by stainless steel plates (reference number 5 of FIG. 2) coated with a graphite mold release agent with dimensions of 60 mm×60 mm×1 mm, multiple such structures were stacked, then 12 mm thick iron plates were placed on both surfaces, connected by six M10 bolts, and clamped by a torque wrench with a clamping torque of 10 Nm in the planar direction to form a block.

Next, the resulting block was preheated to a temperature of 700° C. in an electric furnace, then placed in a preheated press mold with an inner diameter of 300 mm, and an aluminum alloy melt at a temperature of 800° C. was poured in and compressed for 20 minutes at a pressure of 100 MPa to impregnate the diamond grains with the aluminum alloy. After cooling to room temperature, the block was cut to the shapes of the mold release plates using a wet handsaw, and the stainless steel plates were removed. Then, it was annealed for three hours at a temperature of 530° C. to eliminate the strain from impregnation, yielding an aluminum-diamond compact. The resulting aluminum-diamond compact had a diamond grain content of 60% by volume, and a density, measured by Archimedes' Principle, of 3.09 g/cm$^3$.

The resulting aluminum-diamond compact was polished and cut in the same manner as Example 1, to form aluminum-diamond composites of 25 mm×25 mm×2 mm. The cross sections of the resulting aluminum-diamond composites were observed with a factory microscope, and the average thicknesses of both surface layers (reference number 3 of FIG. 1) were measured, upon which the average thickness of the surface layer 2 was found to be 0.06 mm. Additionally, the surface roughness (Ra) when measured with a surface roughness meter was 0.26 μm, and the planarity when measured by a 3D profile measurer was 2 μm.

Additionally, specimens were made in the same manner as Example 1, and measured for thermal conductivity, coefficient of thermal expansion and bending strength. As a result, the coefficient of thermal expansion at temperatures of 25° C. to 150° C. was 7.8×10$^{-6}$/K, the thermal conductivity at a temperature of 25° C. was 520 W/mK and the three-point bending strength was 320 MPa.

Pure aluminum was used in Example 18. As a result, the surface roughness was 0.26 μm and the planarity was 2 μm, thus being very smooth while also having high thermal conductivity and a coefficient of thermal expansion close to that of semiconductor devices.

Examples 19-24

40 mm×40 mm×2 mm stainless steel plates (SUS430) were coated with an alumina sol, baked for 30 minutes at 350° C., then coated on their surfaces with a graphite mold release agent to produce mold release plates (reference number 6 of FIG. 4).

Next, inside an isotropic graphite jig (reference number 4 of FIG. 4) having a porosity of 20%, outer dimensions of 60×60×8.4 mm and a 40 mm×40 mm×8.4 mm hole in a central portion, 6.76 g of diamond powder A (average grain size 190 μm) were loaded so as to be sandwiched between laminar members (reference number 10 of FIG. 4) shown in FIG. 5, and further sandwiched between the load release plates (reference number 6 of FIG. 4).

This was then sandwiched between stainless steel plates (reference number 5 of FIG. 4) coated with a graphite mold release agent with dimensions of 60 mm×60 mm×1 mm, multiple such structures were stacked, and 12 mm thick iron plates were placed on both sides, connected with six M10 bolts, then clamped by a torque wrench with a clamping torque of 10 Nm in the planar direction to form a single block. At this stage, the ceramic fibers were compressed, and the total thickness on both sides was 0.4 mm.

TABLE 5

| Type | Laminar Member Material | Vf of Laminar Member (vol %) | Thickness of Laminar Member (side/mm) |
|---|---|---|---|
| Example 19 | alumina fiber | 5 | 0.4 |
| Example 20 | alumina fiber | 5 | 0.4 |
| Example 21 | alumina fiber | 8 | 0.4 |
| Example 22 | mullite fiber | 5 | 0.4 |
| Example 23 | silica fiber | 5 | 0.4 |
| Example 24 | pure aluminum | 100 | 0.2 |

Next, the resulting blocks were treated using the same method as Example 1 to impregnate the diamond grains with aluminum alloy, yielding aluminum-diamond compacts of 40 mm×40 mm×2.4 mm. The aluminum-diamond compact had a diamond grain content of 50% by volume.

The resulting aluminum-diamond compact was polished in the same manner as Example 1, then cut into pieces measuring 25 mm×25 mm×2.4 mm using a water-jet tool to obtain aluminum-diamond composites. Additionally, in Example 20, both surface layers were ground to about 0.15 mm using a flat grinding disc, then buffed. As a result, Example 20 yielded pieces of 25 mm×25 mm×2.1 mm, having a diamond grain content of 57% by volume.

Then, the cross section of the resulting aluminum-diamond composite was observed with a factory microscope and the average thicknesses of both surface layers 3 (surface layers composed of aluminum-ceramic composite materials) were measured. Additionally, the surface roughness (Ra) was measured using a surface roughness meter and the planarity was measured using a 3D profile measurer. The results are shown in Table 6.

Furthermore, specimens for measurement of coefficient of thermal expansion (3 mm×10 mm×plate thickness) and specimens for measurement of thermal conductivity (25 mm×25 mm×plate thickness) were prepared by electrical discharge cutting. Using the respective specimens, the coefficient of thermal expansion for temperatures of 25° C. to 150° C. and the thermal conductivity at 25° C. were measured in the same manner as Example 1. The results are shown in Table 6.

TABLE 6

| Type | Vf (vol %) | Average Thickness of Surface Layer (mm) | Surface Roughness Ra (μm) | Planarity (μm) | Thermal Conductivity (W/mK) | Coefficient of Thermal Expansion (×10$^{-6}$/K) |
|---|---|---|---|---|---|---|
| Example 19 | 50 | 0.23 | 0.28 | 1 | 420 | 8.5 |
| Example 20 | 57 | 0.09 | 0.27 | 1 | 480 | 7.5 |
| Example 21 | 50 | 0.24 | 0.29 | 2 | 420 | 8.3 |
| Example 22 | 50 | 0.25 | 0.28 | 1 | 410 | 8.6 |
| Example 23 | 50 | 0.24 | 0.31 | 2 | 410 | 8.4 |
| Example 24 | 50 | 0.25 | 0.35 | 2 | 430 | 8.9 |

Next, the aluminum-diamond composite was subjected to ultrasonic cleaning, then non-electrolytic Ni—P and non-electrolytic NiB plating were performed to form an 8 μm thick plating layer (6 μm Ni—P+2 μm NiB). The resulting plated products were subjected to solder flux tests in accordance with JIS Z3197, whereupon all of the plated products had a solder flux of at least 80%.

As shown in Table 6, the aluminum-diamond composites of Examples 19-24 had a surface roughness of 0.28 to 0.35 μm, and were therefore extremely smooth, as well as having high thermal conductivity and coefficients of thermal expansion close to that of semiconductor devices.

Additionally, aside from Example 20 that was subjected to grinding, the average thickness of the surface layer was 0.23 to 0.25 mm, thus demonstrating that surface layers of roughly constant thickness could be formed by providing members such as ceramic fibers.

Examples 25-32

In Example 1, after ultrasonic cleaning of the 25 mm×25 mm×2 mm aluminum-diamond composites formed by water-jet cutting, they were subjected to non-electrolytic plating under the conditions shown in Table 7 to form plating layers on the surfaces of the composites. The results of measurements of the plating thicknesses of the plated products are shown in Table 7.

TABLE 7

| Type | Ni—P Plating Thickness (μm) | Ni—B Plating Thickness (μm) | Au Plating Thickness (μm) | Total Plating Thickness (μm) |
|---|---|---|---|---|
| Example 25 | 8.0 | 2.0 | 0 | 10.0 |
| Example 26 | 6.0 | 0 | 0 | 6.0 |
| Example 27 | 6.0 | 1.0 | 0.05 | 7.05 |
| Example 28 | 6.0 | 0 | 0.05 | 6.05 |
| Example 29 | 3.0 | 1.0 | 0 | 4.0 |
| Example 30 | 0.45 | 0 | 0.05 | 0.5 |
| Example 31 | 0.3 | 0 | 0 | 0.3 |
| Example 32 | 30.0 | 0 | 0 | 30.0 |

Upon performing solder flux tests under JIS Z3197 on these plated products, Example 31 was found to have a smooth surface and both high thermal conductivity and a coefficient of thermal expansion close to semiconductor devices, as well as a solder flux of 75%, but with voids on the solder surface. Upon inspecting these solder voids under a microscope, unplated portions were observed at the centers of the voids. This is probably due to the fact that the plating thickness was less than 0.5 μm.

Additionally, Example 32 was found to have a smooth surface and both high thermal conductivity and a coefficient of thermal expansion close to semiconductor devices, but cracks formed in the plating layer when heating to measure the solder flux. This is probably due to the fact that the plating thickness was more than 10 μm.

On the other hand, with the plated products of Examples 25-30, the solder flux was at least 80%, enabling a higher thermal conductivity to be obtained when used as heat sinks. This is probably due to the fact that the plating thickness was at least 0.5 μm and no more than 10 μm.

The invention claimed is:

1. A plate-shaped aluminum-diamond composite, comprising:
   a composite portion comprising diamond grains and a metal comprising aluminum as its main component,
   wherein said plate-shaped aluminum-diamond composite comprises said composite portion and surface layers provided on both surfaces of said composite portion,
   said diamond grains are present in an amount of from 40% to 70% by volume with respect to the plate-shaped aluminum-diamond composite,
   said surface layers consist of an aluminum-ceramic composite material, and
   a thickness of each of said surface layers is at least 0.03 mm and at most 0.3 mm, and
   the surface roughness (Ra) of said surface layer is at most 1 μm.

2. The plate-shaped aluminum-diamond composite in accordance with claim 1,
   wherein each of said surface layers comprises a metal comprising aluminum as its main component in an amount of at least 80% by volume.

3. The plate-shaped aluminum-diamond composite in accordance with claim 1,
   wherein a thickness of said plate-shaped aluminum-diamond composite is from 0.4 to 6 mm.

4. The plate-shaped aluminum-diamond composite in accordance with claim 1,
   wherein said plate-shaped aluminum-diamond composite has a thermal conductivity of at least 400 W/mK when at a temperature of 25° C., and a coefficient of thermal expansion of from $5 \times 10^{-6}$/K to $10 \times 10^{-6}$/K when a temperature of said plate-shaped aluminum-diamond composite changes from 25° C. to 150° C.

5. The plate-shaped aluminum-diamond composite in accordance with claim 1,
   wherein said surface layers are each provided with a Ni plating layer or both a Ni plating layer and an Au plating layer to a thickness of from 0.5 to 10 μm.

6. The plate-shaped aluminum-diamond composite in accordance with claim 1,
   wherein the plate-shaped aluminum-diamond composite is produced by liquid metal forging.

7. The plate-shaped aluminum-diamond composite in accordance with claim 1,
   wherein said plate-shaped aluminum-diamond composite comprises a hole portion, and said plate-shaped aluminum-diamond composite has a structure in which a composite portion is exposed at a side surface portion and said hole portion.

8. The plate-shaped aluminum-diamond composite in accordance with claim 1, wherein the surface of said diamond grain is covered by a β-type silicon carbide layer.

9. A method of producing the plate-shaped aluminum-diamond composite in accordance with claim 1, the method comprising:
   loading diamond grains into a mold comprising a porous material in a structure sandwiched by mold release plates coated with a mold release agent, to form a structure comprising said mold, said mold release plates, and loaded diamond grains;
   heating said structure to from 600° C. to 750° C.; and
   producing a plate-shaped aluminum-diamond composite comprising both surfaces covered by a surface layer comprising aluminum as a main component, by impregnating the loaded diamond grains with an aluminum alloy heated at least to a melting point of the aluminum alloy at a pressure of at least 20 MPa.

10. A method in accordance with claim 9, further comprising, after the producing:

water-jet cutting or electrical discharge cutting to form a side surface portion and a hole portion in said plate-shaped aluminum-diamond composite.

\* \* \* \* \*